US009337023B1

United States Patent
Fareed et al.

(10) Patent No.: US 9,337,023 B1
(45) Date of Patent: May 10, 2016

(54) BUFFER STACK FOR GROUP IIIA-N DEVICES

(71) Applicant: Texas Instruments Incorporated, Dallas, TX (US)

(72) Inventors: Qhalid Fareed, Richardson, TX (US); Asad Mahmood Haider, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/570,703

(22) Filed: Dec. 15, 2014

(51) Int. Cl.
*H01L 29/15* (2006.01)
*H01L 21/02* (2006.01)
*H01L 29/66* (2006.01)
*H01L 29/20* (2006.01)
*H01L 29/78* (2006.01)

(52) U.S. Cl.
CPC ...... *H01L 21/02513* (2013.01); *H01L 21/0242* (2013.01); *H01L 21/0254* (2013.01); *H01L 21/02378* (2013.01); *H01L 21/02381* (2013.01); *H01L 21/02458* (2013.01); *H01L 21/02505* (2013.01); *H01L 29/2003* (2013.01); *H01L 29/66522* (2013.01); *H01L 29/78* (2013.01)

(58) Field of Classification Search
CPC ................................................. H01L 21/02513
USPC ........................................................... 257/77
See application file for complete search history.

(56) References Cited

U.S. PATENT DOCUMENTS 6,630,695 B2    10/2003    Chen et al.

*Primary Examiner* — Anthony Ho
(74) *Attorney, Agent, or Firm* — Jacqueline J. Garner; Frank D. Cimino

(57) ABSTRACT

A method of fabricating a multi-layer epitaxial buffer layer stack for transistors includes depositing a buffer stack on a substrate. A first voided Group IIIA-N layer is deposited on the substrate, and a first essentially void-free Group IIIA-N layer is then deposited on the first voided Group IIIA-N layer. A first high roughness Group IIIA-N layer is deposited on the first essentially void-free Group IIIA-N layer, and a first essentially smooth Group IIIA-N layer is deposited on the first high roughness Group IIIA-N layer. At least one Group IIIA-N surface layer is then deposited on the first essentially smooth Group IIIA-N layer.

9 Claims, 2 Drawing Sheets

BUFFER STACK FOR GROUP IIIA-N DEVICES

FIELD

Disclosed embodiments relate to Group IIIA-N (e.g., GaN) field effect transistors (FETs), and more particularly to buffer stacks for such FETs.

BACKGROUND

Gallium-nitride (GaN) is a commonly used Group IIIA-N material, where Group IIIA elements such as Ga (as well as boron, aluminum, indium, and thallium) are also sometimes referred to as Group 13 elements. GaN is a binary IIIA/V direct bandgap semiconductor that has a Wurtzite crystal structure. Its relatively wide band gap of 3.4 eV at room temperature (vs. 1.1 eV for silicon) affords it special properties for a wide variety of applications in optoelectronics, as well as high-power and high-frequency electronic devices.

Because GaN and silicon have significant thermal expansion coefficient mismatches, buffer layers are commonly used between the silicon substrate and the GaN layer for strain management. This buffer technology forms the basis of most GaN-on-Si technology commonly used for high-electron-mobility transistor (HEMT), also known as heterostructure FET (HFET) or modulation-doped FET (MODFET) devices, which are field-effect transistors incorporating a junction between two materials with different band gaps (i.e. a heterojunction) as the channel instead of a doped region (as is generally the case for a MOSFET). Some buffer arrangements for such devices use either super lattice structures or a graded buffer structure.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize known buffer stacks for Group IIIA-N devices that use either super lattice structures or graded buffers have associated limitations. Graded buffer structures impose limitations on thickness due to cracking that results in a low device breakdown voltage, and super lattice structures have high leakage current, bowing/warping, and a slow growth rate.

Disclosed buffer stacks instead intentionally introduce layers with voids for strain relaxation and layers without voids to improve the buffer stack quality. Additionally, disclosed buffer stacks help in growing thicker layers which have a reduced density of defects such as pits and voids which can as a result withstand higher breakdown voltages, such as disclosed power transistors achieving a breakdown voltage greater than 100V at a leakage current of 1 µamp/mm$^2$.

BRIEF DESCRIPTION OF THE DRAWINGS

Reference will now be made to the accompanying drawings, which are not necessarily drawn to scale, wherein.

DETAILED DESCRIPTION

Figure 1:
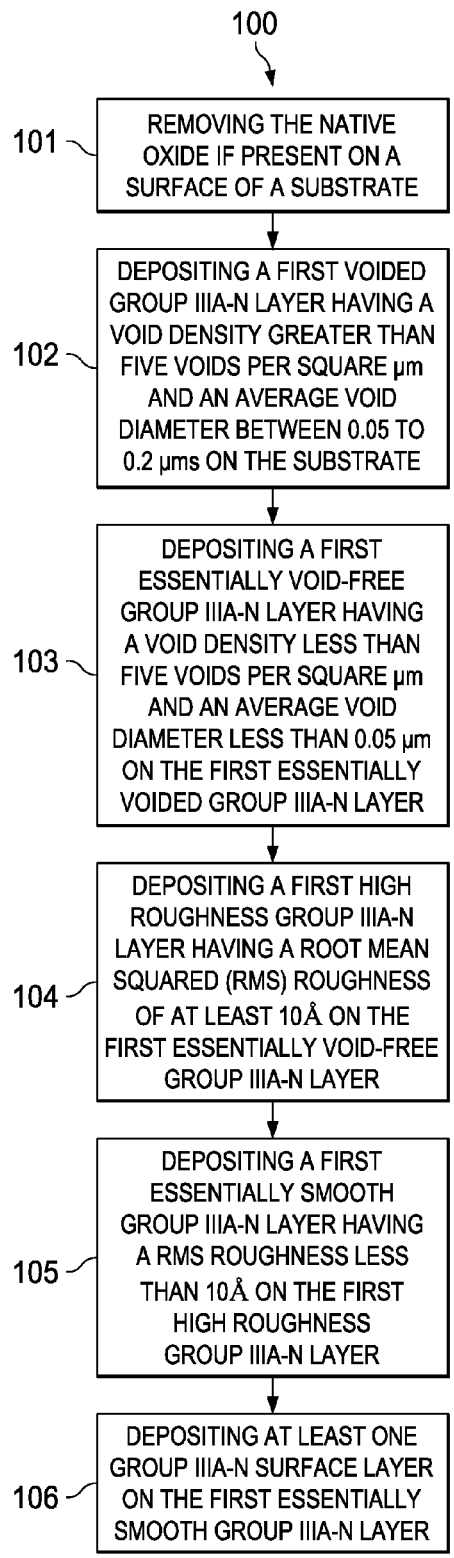
FIG. 1 is a flow chart that shows steps in an example method of fabricating a multi-layer buffer layer stack then a Group IIIA-N surface layer thereon for forming for a power Group IIIA-N transistor device, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 of fabricating a multi-layer buffer layer stack then a Group IIIA-N surface layer thereon for forming a Group IIIA-N power transistor device, according to an example embodiment. All respective buffer and Group IIIA-N surface layers can be deposited by metal-organic chemical vapor deposition (MOCVD), molecular beam epitaxy (MBE), or hydride vapor phase epitaxy (HVPE).

Step 101 comprises removing the native oxide if present on a surface of a substrate. The substrate can comprise sapphire, silicon or silicon carbide (SiC). The Group IIIA-N layer may be represented by the general formula $Al_xGa_yIn_{1-x-y}N$, where $0 < x \leq 1$, $0 \leq y \leq 1$, $0 < x+y \leq 1$. For example, the Group IIIA-N layer can comprise at least one of, AlN, AlGaN, AlInN, and AlInGaN. Other Group IIIA elements such as boron (B) may be included, and N may be partially replaced by phosphorus (P), arsenic (As), or antimony (Sb). Each of the Group IIIA nitride compound semiconductors may contain an optional dopant selected from Si, C, Ge, Se, O, Fe, Mn, Mg, Ca, Be, Cd, and Zn. The Group IIIA-N layer(s) may be formed by processes including MBE, MOCVD or HVPE.

The layers deposited in steps 102 to 105 described below may all be considered buffer layers in steps. Step 102 comprises depositing a first voided Group IIIA-N layer having a void density greater than 5 voids per square µm and an average void diameter between 0.05 to 0.2 µm on the substrate. The voids can be formed by changing the temperature, deposition pressure and Group IIIA to N ratio, or a combination of any of these parameters. Step 103 comprises depositing a first essentially void-free Group IIIA-N layer having a void density less than 5 voids per square µm and an average void diameter less than 0.05 µm on the first essentially voided Group IIIA-N layer. An essentially void-free Group IIIA-N layer is a standard Group IIIA-N layer.

Step 104 comprises depositing a first high roughness Group IIIA-N layer having a root mean square (rms) roughness of at least 10 Å on the first essentially void-free Group IIIA-N layer. Step 105 comprises depositing a first essentially smooth Group IIIA-N layer having an rms roughness less than 10 Å on the first high roughness Group IIIA-N layer. In one embodiment the rms roughness of the first high roughness Group IIIA-N layer is from 15 Å to 50 Å, and the rms roughness of the first essentially smooth Group IIIA-N layer is between 1 Å and 10 Å. Step 106 comprises depositing at least one Group IIIA-N surface layer on the first essentially smooth Group IIIA-N layer. The plurality of buffer layers in disclosed buffer layer stacks are generally all essentially crack-free having zero cracks measured by a defect analysis tool such as the KLA-Tencor CANDELA® 8620 Inspection System beyond a 5 mm edge exclusion of the substrate.

In one embodiment step 106 comprises depositing a Group IIIA-N tri-layer stack having an AlGaN layer sandwiched between a first GaN layer and a second GaN layer, where both GaN layers have different doping levels, such as by at least one order of magnitude. In one example, the first GaN layer has a lower doping level compared to second GaN layer and in another case, the first GaN layer has higher doping level compared to second GaN layer. In one embodiment, dopant levels range between $1\times10^{15}$ atoms/cm$^3$ to $1\times10^{17}$ atoms/cm$^3$ in the first GaN layer and dopant levels in second GaN layer range between $1\times10^{17}$ atoms/cm$^3$ to $1\times10^{20}$ atoms/cm$^3$. In another embodiment, the dopant levels are ranging between $1\times10^{16}$ atoms/cm$^3$ and $1\times10^{17}$ atoms/cm$^3$ in first GaN layer and dopant levels in second GaN layer range between $1\times10^{17}$ atoms/cm$^3$ and $1\times10^{18}$ atoms/cm$^3$, or vice versa.

The method 100 generally also includes forming a gate dielectric layer (e.g., SiN or SiON) on the Group IIIA-N surface layer(s), forming a metal gate electrode on the gate dielectric layer, and forming a source contact and a drain contact on the Group IIIA-N surface layer(s). The gate electrode can comprise a TiW alloy in one embodiment. The contacts can be formed by sputtering a metal stack such as Ti/Al/TiN in one embodiment.

Figure 2A:
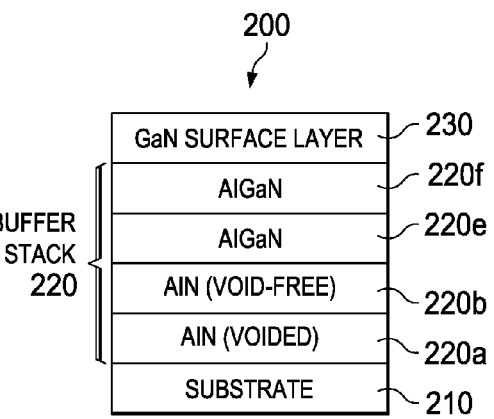
FIG. 2A is a cross sectional depiction of an example device stack that includes a multi-layer buffer stack on a substrate with a voided Group IIIA-N layer and a void-free Group IIIA-N layer thereon both shown as AlN layers, and a rough Group IIIA-N layer and a smooth Group IIIA-N layer thereon both shown as AlGaN layers on the AlN layers, according to an example embodiment.

FIG. 2A is a cross sectional depiction of an example device stack 200 that includes a multi-layer buffer stack 220 with a voided Group IIIA-N layer 220a, and a void-free Group IIIA-N layer 220b both shown as AlN layers on a substrate (e.g., silicon) 210, and a rough Group IIIA-N layer 220e and a smooth Group IIIA-N layer 220f on the AlN layers, both shown as AlGaN layers, according to an example embodiment. A Group IIIA-N surface layer 230 shown as a GaN layer is on the smooth Group IIIA-N layer 220f.

Figure 2B:
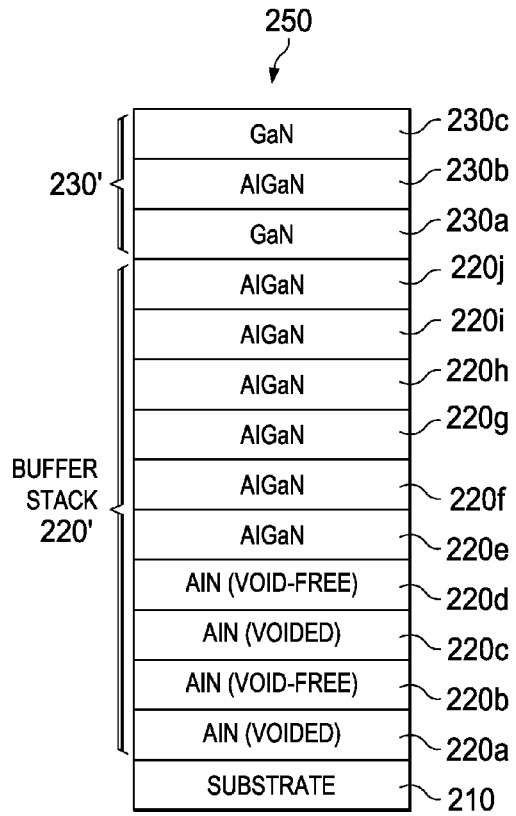
FIG. 2B is a cross sectional depiction of an example device stack that includes a multi-layer buffer stack on a substrate with alternating voided Group IIIA-N layers and void-free Group IIIA-N layers all shown as AlN layers on a substrate, and an alternating rough and smooth Group IIIA-N layer stack all shown as being AlGaN layers, according to an example embodiment.

FIG. 2B is a cross sectional depiction of an example device stack 250 that includes a multi-layer buffer stack 220' with alternating voided Group IIIA-N layers and void-free Group IIIA-N layers 220a (voided), 220b (essentially void-free), 220c (voided) and 220d (essentially void-free), all shown as AlN layers, and an alternating rough and smooth Group IIIA-N layer stack 220e (rough), 220f (smooth), 220g (rough), 220h (smooth), 220i (rough) and 220j (smooth) all shown as being AlGaN layers, on a substrate 210. For example, the layers 220e 220g, and 220i being higher roughness layers have been found to improve the interlayer adhesion while layers 220f, 220h, and 220j are lower roughness/smoother layers that have been found to fill in voids originating from the rougher layer below. A Group IIIA-N surface layer 230' is shown including a topmost GaN layer 230c on a middle AlGaN layer 230b on a bottommost GaN layer 230a which is on the smooth AlGaN layer 220j of the multi-layer buffer stack 220'.

Example thickness ranges for the for the Group IIIA-N surface layer 230' shown in FIG. 2B can be 5 Å to 300 Å for the topmost GaN layer 230c that can be used as a HEMT layer, 50 Å to 300 Å for the middle AlGaN layer 230b, 0.1 to 5 µm for the bottommost GaN layer 230a. Regarding multi-layer buffer stack 220', example thicknesses include a 0.1 to 1.0 µm for layer 220j, 0.1 to 1.0 µm for layer 220i, 0.1 to 1.0 µm for layer 220h, 0.1 to 1.0 µm for layer 220g, 0.1 to 1.0 µm for layer 220f, 0.1 to 1.0 µm for layer 220e, 0.05 to 0.5 µm for layers 220b and 220d, and 0.05 to 0.5 µm for layers 220a and 220c.

Advantages of disclosed embodiments include the ability to deposit a crack-free thicker than conventional GaN film stack such as about two micron to obtain higher transistor device breakdown voltage, lower leakage current, and reduced substrate bow/warp. For example, disclosed power transistors can provide a breakdown voltage of at least of 100V at a leakage current density of 1 µamp per mm$^2$.

Examples of power semiconductor devices that can utilize disclosed multi-layer buffer layer embodiments include HEMT, double heterostructure field effect transistors (DH-FETs), heterojunction bipolar transistors (HBTs) and bipolar junction transistors (BJTs). A HEMT, also known as heterostructure FET (HFET) or modulation-doped FET (MOD-FET), is a field-effect transistor incorporating a junction between two semiconductor materials with different band gaps (i.e. a heterojunction) as the two dimensional electron gas (2DEG) channel layer instead of a doped region (as is generally the case for a metal-oxide-semiconductor field-effect transistor (MOSFET)). The HEMT includes a compound semiconductor having a wide band gap such as GaN and AlGaN. Due to high electron saturation velocity in GaN and IIIA-N materials systems, the electron mobility in GaN HEMT is higher than that of other general transistors such as Metal Oxide Semiconductor Field Effect Transistors (MOSFETs).

Therefore, the breakdown voltage of the HEMT may be greater than that of other general transistors. The breakdown voltage of the HEMT may increase in proportion to a thickness of the compound semiconductor layer including the 2DEG, for example, a GaN layer.

Figure 3A:
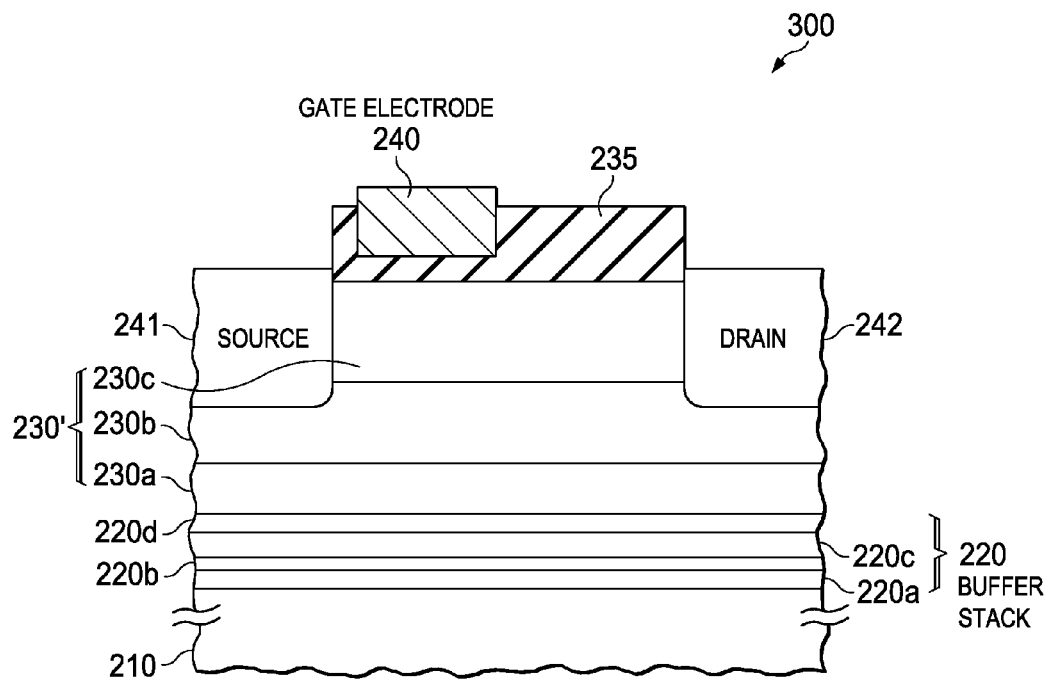
FIG. 3A is a cross sectional view of an example depletion-mode high-electron-mobility transistor (HEMT) power device with a disclosed multi-layer buffer layer stack, according to an example embodiment.

FIG. 3A is a cross sectional view of an example depletion-mode HEMT power device 300 with a disclosed multi-layer buffer stack 220 on a substrate 210, according to an example embodiment. The substrate is shown as 210. HEMT power device 300 is shown having a gate dielectric layer 235 such as comprising silicon nitride or silicon oxynitride. In this embodiment the Group IIIA-N surface layer comprises a Group IIIA-N tri-layer stack which is on the essentially void-free layer 220d. The Group IIIA-N tri-layer stack can comprise an AlGaN layer 230b sandwiched between a topmost (first) GaN layer 230c and bottommost (second) GaN layer 230a that is on the essentially void-free layer 220d. The topmost and bottommost GaN layers 230c, 230a generally have a doping concentration between $1\times10^{15}$ cm$^{-3}$ and $1\times10^{18}$ cm$^{-3}$.

HEMT power device 300 can be a discrete device, or one of many devices on an IC. More generally, the Group IIIA-N layer 230' may include one or more of GaN, InN, AlN, AlGaN, AlInN, InGaN, and AlInGaN. As noted above the Group IIIA-N layers can include other Group IIIA elements such as B, and N may be partially replaced by P, As, or Sb, and may also contain an optional dopant. In another specific example, the Group IIIA-N layer 230' can comprise a GaN layer on top of an Al$_x$Ga$_y$N layer or an In$_x$Al$_y$N layer. Yet another specific example is the Group IIIA-N layer 230' being a tri-layer stack can comprise GaN on InAlN on AlGaN.

HEMT power device 300 includes a source 241, a drain 242, and a gate electrode 240. Gate electrode 240 is positioned between the source 241 and drain 242, closer to the source 241 than the drain 242. The source 241, drain 242, and gate electrode 240 may be formed of metals and/or metal nitrides, but example embodiments are not limited thereto.

Figure 3B:
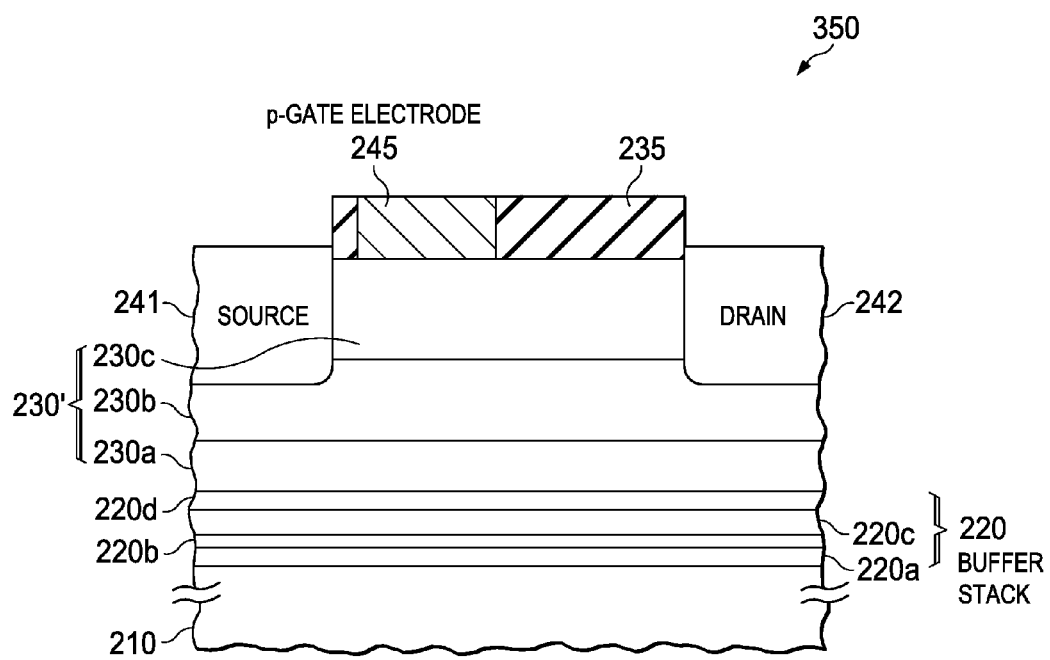
FIG. 3B is a cross sectional view of an example enhancement-mode HEMT power device with a normally off gate with a disclosed multi-layer buffer layer stack, according to an example embodiment.

FIG. 3B is a cross sectional view of an example enhancement-mode HEMT power device 350 with a normally off gate with a disclosed multi-layer buffer stack 220 on a substrate 210, according to an example embodiment. In this embodiment, the gate electrode is a p-doped gate electrode 245 that is in direct contact with the Group IIIA-N layer 230c (e.g., GaN layer).

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of fabricating an epitaxial layer stack for a transistor, comprising:
   depositing a multi-layer buffer stack having a plurality of buffer layers including:
      depositing a first voided Group IIIA-N layer having a void density greater than 5 voids per square μm and an average void diameter between 0.05 to 0.2 μms on a substrate;
      depositing a first essentially void-free Group IIIA-N layer having a void density less than 5 voids per square μm and an average void diameter less than 0.05 μm on said first voided Group IIIA-N layer;
      depositing a first high roughness Group IIIA-N layer having an root mean squared (rms) roughness of at least 10 Å on said first essentially void-free Group IIIA-N layer, and
      depositing a first essentially smooth Group IIIA-N layer having an rms roughness less than 10 Å on said first high roughness Group IIIA-N layer, and
   depositing at least one Group IIIA-N surface layer on said first essentially smooth Group IIIA-N layer.

2. The method of claim 1, wherein said rms roughness of said first high roughness Group IIIA-N layer is from 15 Å to 50 Å, and wherein said rms roughness of said first essentially smooth Group IIIA-N layer is between 1 Å and 10 Å.

3. The method of claim 1, wherein said depositing said multi-layer buffer stack further comprises:
   depositing a second voided Group IIIA-N layer having a void density greater than 5 voids per square μm and an average void diameter between 0.05 to 0.2 μms on said first essentially void-free Group IIIA-N layer;
   depositing a second essentially void-free Group IIIA-N layer having a void density less than 5 voids per square μm and an average void diameter less than 0.05 μm on said second voided Group IIIA-N layer;
   depositing a second high roughness Group IIIA-N layer having an rms roughness of at least 10 Å on said second essentially void-free Group IIIA-N layer, and
   depositing a second essentially smooth Group IIIA-N layer having an rms roughness less than 10 Å on said second high roughness Group IIIA-N layer.

4. The method of claim 1, wherein said Group IIIA-N surface layer comprises GaN or AlGaN.

5. The method of claim 1, wherein said depositing said at least one Group IIIA-N surface layer comprises depositing a Group IIIA-N tri-layer stack including a AlGaN layer sandwiched between a first GaN layer and a second GaN layer, wherein said first GaN layer and said second GaN layer both have a doping concentration between $1 \times 10^{15}$ cm$^{-3}$ and $1 \times 10^{18}$ cm$^{-3}$.

6. The method of claim 1, wherein said substrate comprises sapphire, silicon or silicon carbide (SiC).

7. The method of claim 1, wherein said first voided Group IIIA-N layer and said first essentially void-free Group IIIA-N layer comprise AlN and said first high roughness Group IIIA-N layer and said first essentially smooth Group IIIA-N layer both comprise AlGaN.

8. The method of claim 1, wherein said plurality of buffer layers are all essentially crack-free having zero cracks beyond a 5 mm edge exclusion of said substrate.

9. The method of claim 1, further comprising:
   forming a gate dielectric layer on said Group IIIA-N surface layer;
   forming a metal gate electrode on said gate dielectric layer, and
   forming a source contact and a drain contact on said Group IIIA-N surface layer.

* * * * *